(12) United States Patent
Song et al.

(10) Patent No.: US 11,848,049 B2
(45) Date of Patent: *Dec. 19, 2023

(54) PHASE-CHANGE MEMORY DEVICE FOR IMPROVING RESISTANCE DRIFT AND DYNAMIC RESISTANCE DRIFT COMPENSATION METHOD OF THE SAME

(71) Applicant: Samsung Electronics Co., Ltd., Suwon-si (KR)

(72) Inventors: Yunheub Song, Seongnam-si (KR); Yoonseong Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/857,581

(22) Filed: Jul. 5, 2022

(65) Prior Publication Data

US 2022/0336014 A1 Oct. 20, 2022

Related U.S. Application Data

(63) Continuation of application No. 17/076,316, filed on Oct. 21, 2020, now Pat. No. 11,410,722.

(51) Int. Cl.
  *G11C 11/00* (2006.01)
  *G11C 13/00* (2006.01)

(52) U.S. Cl.
  CPC ...... *G11C 13/0026* (2013.01); *G11C 13/0004* (2013.01)

(58) Field of Classification Search
  CPC ............ G11C 13/0026; G11C 13/0004; G11C 2013/0078; G11C 13/0069; G11C 2213/77; G11C 2213/82; G11C 13/003

(Continued)

(56) References Cited

U.S. PATENT DOCUMENTS 3,886,577 A     5/1975   Buckley
3,922,648 A * 11/1975   Buckley .............. G11C 13/0011
                                                     365/163

(Continued)

FOREIGN PATENT DOCUMENTS

KR    10-2016-0039435 A    4/2016

OTHER PUBLICATIONS

Notification of Reason for Refusal dated Feb. 21, 2020 in Korea Application No. 10-2019-0001783.

(Continued)

*Primary Examiner* — Tha-O H Bui

(74) *Attorney, Agent, or Firm* — HARNESS, DICKEY & PIERCE, P.L.C.

(57) ABSTRACT

A phase-change memory device and a dynamic resistance drift compensation method thereof are provided. The phase-change memory device includes a plurality of bit lines; a plurality of source lines crossing the plurality of bit lines; a plurality of memory cells at respective intersections between the plurality of bit lines and the plurality of source lines, the plurality of memory cells each including a phase-change layer; a current generator connected to the plurality of bit lines and configured to generate a set current to be supplied to each of the plurality of memory cells; and a control driver configured to control the current generator and the plurality of bit lines to supply the set current to each of the plurality of memory cells.

20 Claims, 5 Drawing Sheets

(58) Field of Classification Search
USPC .......................................................... 365/148
See application file for complete search history.

(56) References Cited

U.S. PATENT DOCUMENTS

| | | | | |
|---|---|---|---|---|
| 7,304,885 | B2* | 12/2007 | Cho | G11C 13/0069 |
| | | | | 365/194 |
| 9,514,813 | B2 | 12/2016 | Lee et al. | |
| 9,558,823 | B1 | 1/2017 | Khwa et al. | |
| 9,627,055 | B1* | 4/2017 | Robustelli | G06F 13/1657 |
| 10,163,505 | B2* | 12/2018 | Lee | G11C 13/004 |
| 2011/0134685 | A1 | 6/2011 | Kau et al. | |

OTHER PUBLICATIONS

Grant of Patent dated Jul. 7, 2020 in Korea Application No. 10-2019-0001783.
Non-Final Office Action dated Sep. 30, 2021 in U.S. Appl. No. 17/076,316.
Notice of Allowance dated Apr. 8, 2022 in U.S. Appl. No. 17/076,316.

* cited by examiner

FIG. 3

| State | Set | Mid | Amorphous |
|---|---|---|---|
| $I_{SET}$ | Identical | | |
| Mid | Low (Low Set Temp) | Mid (Mid Set Temp) | High (Max Set Temp) |
| Set rate | Min | Mid | Max |
| Resistance Change | ~0 | Mid | Max |

PHASE-CHANGE MEMORY DEVICE FOR IMPROVING RESISTANCE DRIFT AND DYNAMIC RESISTANCE DRIFT COMPENSATION METHOD OF THE SAME

CROSS-REFERENCE TO RELATED APPLICATION

This application is a Continuation of, and claims priority under 35 U.S.C. § 120 to, U.S. application Ser. No. 17/076,316, filed on Oct. 21, 2020, the entire contents of which is incorporated herein by reference.

BACKGROUND

A phase-change memory device may have a structure in which a plurality of memory cells are arranged at intersections between a plurality of bit lines and a plurality of source lines.

The phase-change memory device having such a structure may select a bit line from the plurality bit lines and a source line from the plurality of source lines and apply a voltage to the selected bit line and the selected source line such that the state of a phase-change layer of a selected memory cell at the intersection between the selected bit line and the selected source line changes between a crystalline state (which is a set state having low resistance) and an amorphous state (which is a reset state having high resistance), thereby representing a memory state of a binary value of 0 or 1 according to the set state or the reset state.

However, environmental conditions, caused by unstable surroundings (e.g., temperature and humidity), may cause material degradation, such as phase separation, in the phase-change layer. For example, the material degradation may cause resistance drift in which the resistance of the phase-change layer in an amorphous state increases thereby increasing the energy required to set the memory cell and/or potentially decreasing the number of available memory cells. Therefore, a technique to recover from the resistance drift and to prevent degradation in memory cell characteristics may help improve the functionality and life-expectancy of phase-change memory devices.

SUMMARY

An example embodiment of the inventive concepts provides a phase-change memory device including a plurality of bit lines; a plurality of source lines crossing the plurality of bit lines; a plurality of memory cells at respective intersections between the plurality of bit lines and the plurality of source lines, the plurality of memory cells each including a phase-change layer, the phase-change layer configured to change state; a current generator connected to the plurality of bit lines and configured to generate a set current to be supplied to each of the plurality of memory cells; and a control driver configured to control the current generator and the plurality of bit lines to supply the set current to each of the plurality of memory cells based on the state of the phase-change layer.

According to another example embodiment of the inventive concepts, there is provided a dynamic resistance drift compensation device including a plurality of bit lines; a plurality of source lines crossing the plurality of bit lines; a plurality of memory cells at respective intersections between the plurality of bit lines and the plurality of source lines, and each of the plurality of memory cells including a phase-change layer, the phase-change layer configured to change state; a current generator connected to the plurality of bit lines and configured to generate a set current to be supplied to each of the plurality of memory cells; and a control driver configured to control the current generator and the plurality of bit lines to set a value of the set current, and supply the set current to each of the plurality of memory cells such that each of the plurality of memory cells recovers.

According to another example embodiment of the inventive concepts, there is provided a method of a phase-change memory device including setting a value of the set current to be supplied to a memory array, the memory array including a plurality of memory cells; and supplying the set current to each of the plurality of memory cells such that the plurality of memory cells to recovers from resistance drift.

BRIEF DESCRIPTION OF THE DRAWINGS

Some example embodiments of the inventive concepts will be more clearly understood from the following detailed description taken in conjunction with the accompanying drawings in which:

FIG. 3 is a diagram for describing a method of supplying a set current in a phase-change memory device, according to an example embodiment;

DETAILED DESCRIPTION OF THE EMBODIMENTS

Figure 1:
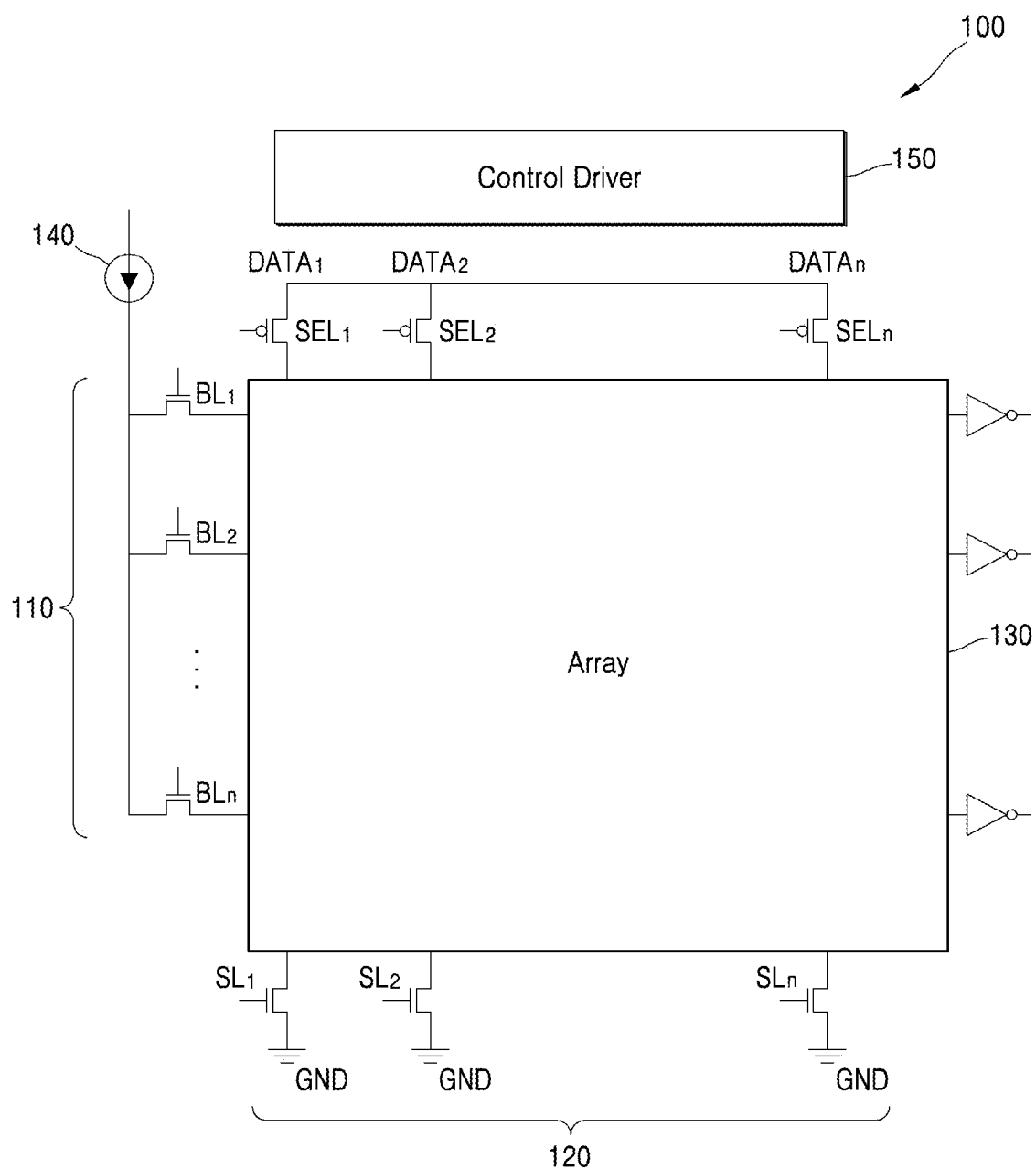
FIG. 1 is a diagram of a phase-change memory device according to an example embodiment.

Hereinafter, embodiments will be described in detail with reference to the accompanying drawings. However, the inventive concepts are not limited to the example embodiments. In the drawings, like reference numerals denote like elements.

The terminology used herein is for the purpose of describing particular embodiments only and may vary with users' or operators' intentions or convention in the field of the art. Therefore, the terms used herein should be defined based on the overall content of the specification.

Figure 2:
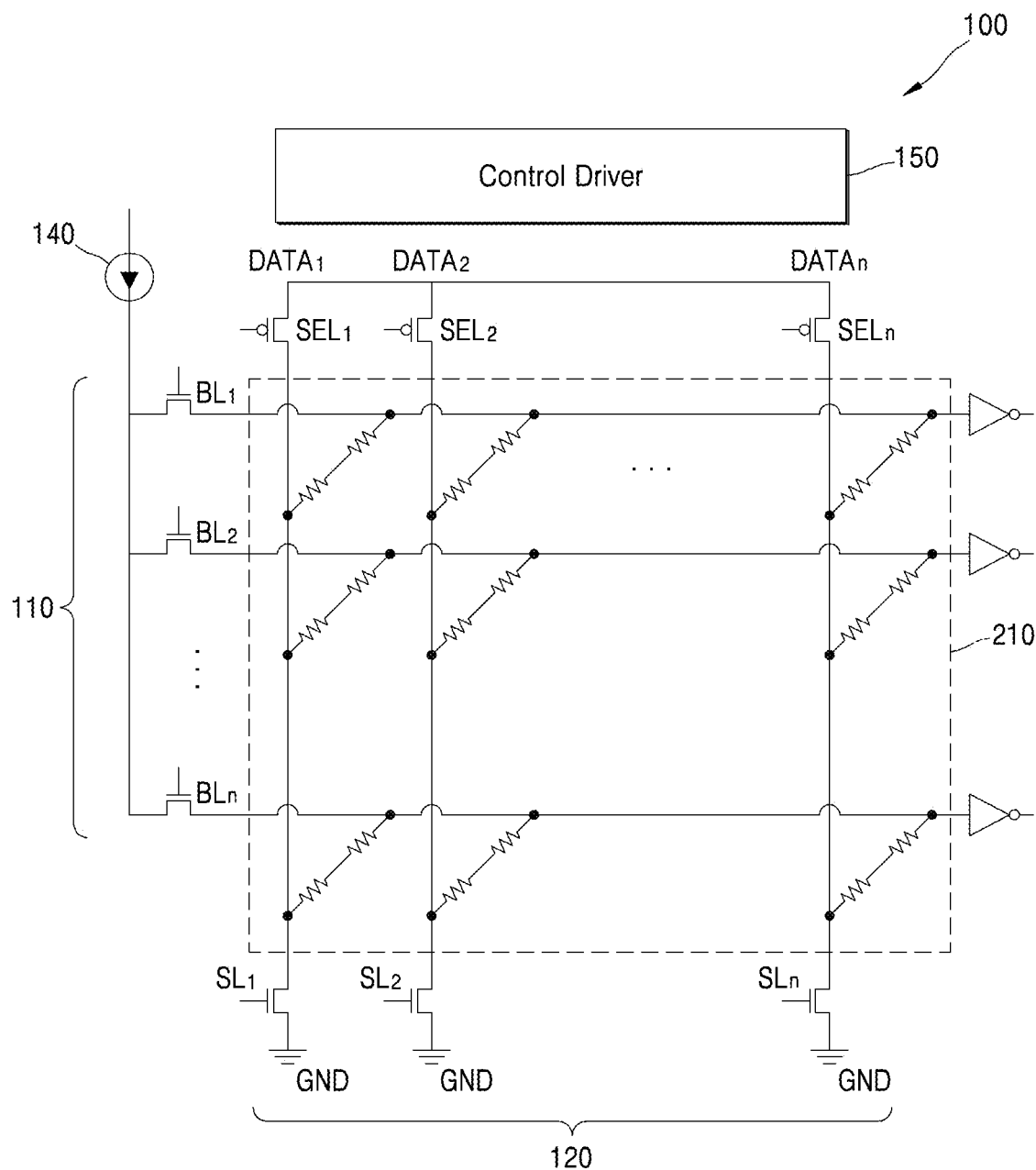
FIG. 2 is a diagram for describing an array of the phase-change memory device of FIG. 1.
Figure 4:
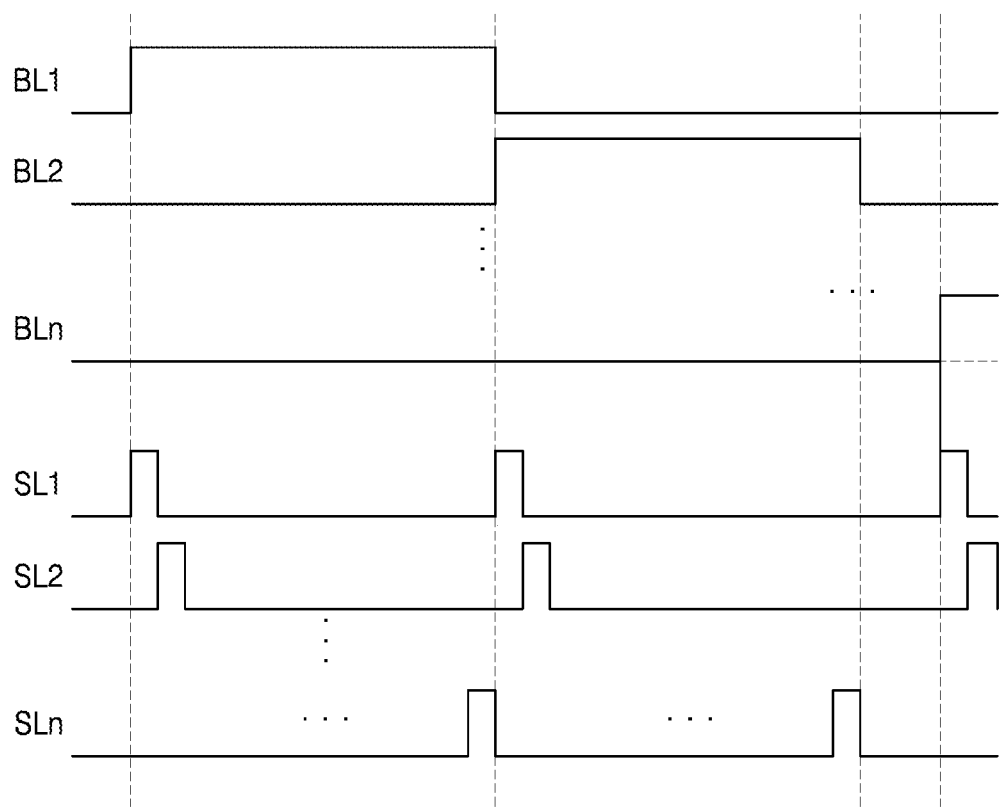
FIG. 4 is a diagram for describing a recovery operation according to the state of a phase-change layer in a phase-change memory device, according to an example embodiment.

FIG. 1 is a diagram of a phase-change memory device according to an example embodiment; FIG. 2 is a diagram for describing an array of the phase-change memory device of FIG. 1; FIG. 3 is a diagram for describing a method of supplying a set current in a phase-change memory device, according to an example embodiment; and FIG. 4 is a diagram for describing a recovery operation according to the state of a phase-change layer in a phase-change memory device, according to an example embodiment.

Referring to FIGS. 1 through 4, a phase-change memory device 100 may include a plurality of bit lines 110, a plurality of source lines 120 arranged to cross the bit lines 110, a memory array 130, a current generator 140 connected to the bit lines 110, and a control driver 150.

The memory array 130 may include a plurality of memory cells 210, as shown in FIG. 2. The memory cells 210 are respectively arranged at intersections of the bit lines 110 and the source lines 120 and each may include a phase-change layer. For example, each of the memory cells 210 may include the phase-change layer corresponding to a data storage portion. The phase-change layer may change between a crystalline state (which is a set state having low resistance) and an amorphous state (which is a reset state having high resistance). The phase-change layer may be configured such that the phase of the layer changes according to a voltage and/or current applied between the bit lines 110 and the source lines 120 and may represent a memory state of a binary value of 1 or 0 according to the set state and/or the reset state, respectively. For example, the phase-change layer may be configured to phase change from a crystalline state (e.g., low resistance state) to an amorphous state (e.g., high resistance state) in a reset operation and/or from the amorphous state to the crystalline state in a set operation. The reset operation and/or the set operation may be facilitated by heating the phase-change layer such that the phase-change layer crystallizes, semi-crystallizes, and/or melt-quenches. The phase-change layer may also be configured to maintain a metastable semi-crystalline state. The semi-crystalline state and the crystalline set state may allow each of the phase-change layers to store more than one bit. Such a phase-change layer may have the same configuration and/or composition as a phase-change layer according to the related art, and thus further detailed descriptions thereof will be omitted.

Each of the memory cells 210 may further include an ovonic threshold switch (OTS), which may be configured to perform a switching operation on the phase-change layer. For example, the OTS may be configured to switch from a resistance state to a conducting state when a holding current and/or voltage is applied, and revert back to the resistance state when the holding current and/or voltage falls below a threshold value. The OTS may have the same configuration as an OTS according to the related art, and thus further detailed descriptions thereof will be omitted.

The current generator 140 may be connected to the bit lines 110 and may be configured to generate a set current $I_{SET}$ to be supplied to each of the memory cells 210. Hereinafter, the set current $I_{SET}$ refers to a recovery and/or refresh current, which may be used for the compensation and/or recovery of resistance drift occurring in the memory cells 210.

The control driver 150 may be configured to control the current generator 140 and the bit lines 110 such that the set current $I_{SET}$ is supplied to each of the memory cells 210. For example, the control driver 150 may be configured to control a timing at which the set current $I_{SET}$ generated by the current generator 140 is supplied to the bit lines 110. The control driver 150 may sequentially supply the set current $I_{SET}$ to the memory cells 210 at certain time intervals by controlling the timing of supplying the set current $I_{SET}$ generated by the current generator 140, as shown in FIG. 3, using a transistor in each of the bit lines 110. In an example embodiment, the control driver 150 may be configured to control a transistor (not illustrated) in an application line (not illustrated) to which a control clock (not illustrated) is applied to control the timing of a current flowing in the memory cells 210 through each of the bit lines 110. The control driver 150 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The control driver 150 may sequentially supply, as illustrated in FIG. 4, the set current $I_{SET}$ generated by the current generator 140 to the memory cells 210 at certain time intervals such that the set current $I_{SET}$ having the same value may be supplied to the memory cells 210. For example, control driver 150 may be configured to sequentially supply the set current $I_{SET}$ to the memory cells 210 connected to a bit line of the plurality of bit lines 110 at set time intervals, and then sequentially supply the set current $I_{SET}$ to the memory cells 210 connected to another bit line of the plurality of bit lines 110 at the set time interval.

For this control, the control driver 150 may be connected to the current generator 140, the bit lines 110, the source lines 120, and/or the application lines to which a control clock is applied and may also be connected to a bit line control driver and/or a source line control driver.

The control driver 150 may be configured to periodically set a value for the set current $I_{SET}$ and control the supply of the set current $I_{SET}$ generated by the current generator 140 to the memory array 130. For example, the set current $I_{SET}$ may be set and supplied according to a reference schedule and/or when resistance value, measured from a downstream sensor, indicates that the measured resistance of an element included in the memory array 130 has exceeded a comparison value. The control driver 150 may also be configured to supplied set the current $I_{SET}$ to each of the memory cells 210 based on a received command.

As shown in FIG. 3, a resistance drift value may vary with the state (e.g., a crystalline "set" state, an amorphous state, and/or an intermediate "mid" state which is a combination of crystalline and amorphous phases) of a phase-change layer of each of the memory cells 210. For example, maximum resistance drift occurs in the amorphous state, and minimum resistance drift occurs in the crystalline state. Accordingly, when a set current $I_{SET}$ having the same value is supplied to the memory cells 210 in different states, each of the memory cells 210 may produce heat differently due to the different resistances of the different states and thus have a different degree of recovery (e.g., a different decrease in resistance).

Therefore, the control driver 150 may be configured to set the set current $I_{SET}$ to a value allowing a partial set operation to be performed according to the state (e.g., the crystalline, amorphous, and/or intermediate state) of each of the memory cells 210 before the current generator 140 generates the set current $I_{SET}$. Then, the current generator 140 may generate the set current $I_{SET}$ having the value set by the control driver 150.

For example, because the value set as the set current $I_{SET}$ to allow a partial set operation to be performed according to the state of each of the memory cells 210 may also be set to allow each of the memory cells 210 to recover from resistance drift, the control device 150 may be configured to control the current generator 150 and the bit lines 110 such that each of the memory cells 210 recovers according to the state thereof due to the set current $I_{SET}$.

As described above, under the same set current $I_{SET}$, the temperatures of the different memory cells may be different, based on the state thereof. For example, the memory cells 210 may have a different temperature according to the state of the memory cells 210 and may thus be characterized by having a different partial set rate according to a cell temperature that is different according to the state thereof. For example, the higher resistance of the amorphous phase may generate greater heat than the lower resistance of the crystalline phase. Accordingly, the control driver 150 may be configured to allow each of the memory cells 210 to recover according to the state of each memory cell 210 using the above-described characteristic. For example, the control driver 150 may set the set current $I_{SET}$ such that the heat produced by the resistance of the amorphous phase partially sets the phase-change layer, thereby reducing the resistance in phase-change layers with amorphous states.

Figure 5:
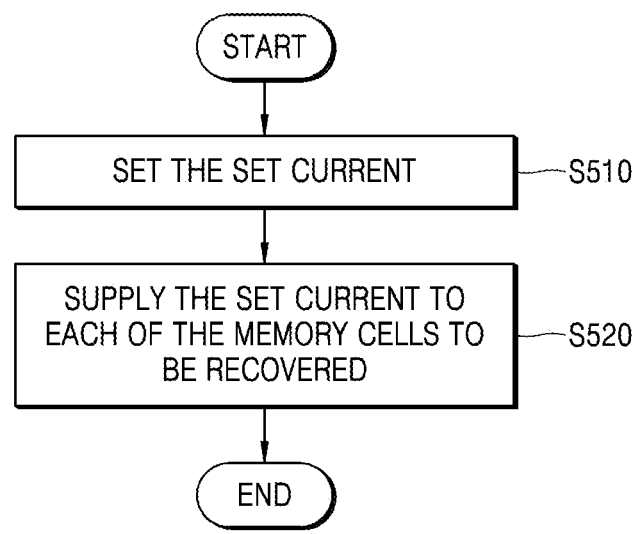
FIG. 5 is a flowchart of a dynamic resistance drift compensation method of a phase-change memory device, according to an example embodiment.

FIG. 5 is a flowchart of a dynamic resistance drift compensation method of a phase-change memory device, according to an example embodiment.

Referring to FIG. 5, the dynamic resistance drift compensation method is performed by the phase-change memory device 100 described above with reference to FIGS. 1 through 4.

The phase-change memory device 100 sets a value of set current in operation S510.

For example, the phase-change memory device 100 may be configured to set the set current to a value which allows a partial set operation to be performed according to the state of each of a plurality of memory cells. The set current may be set by processing circuitry (e.g., a control driver 150) and produced by the current generator 140.

In addition, the phase-change memory device 100 may set the set current to the value, which allows each memory cell to recover from resistance drift.

Thereafter, the phase-change memory device 100 supplies the set current to each of the memory cells in operation S520 so that the memory cells recover.

For example, the phase-change memory device 100 may sequentially supply the set current to the memory cells at certain time intervals in operation S520. The phase-change memory device 100 may be configured to control a current generator and a plurality of bit lines to supply the set current having the same value to the memory cells such that each of the memory cells recovers according to the state thereof due to the set current. Therefore, the phase-change memory device 100 may allow each of the memory cells to recover according to the state thereof using the fact that a partial set rate varies with a cell temperature, depending on the state of each memory cell set by the set current.

While the inventive concepts have been particularly shown and described with reference to embodiments thereof, it will be understood that various changes in form and details may be made therein without departing from the spirit and scope of the following claims.

What is claimed is:

1. A method for compensating resistance drifts of a plurality of memory cells, the method comprising:
generating a set current having a value such that each of the plurality of memory cells recovers from a resistance drift;
supplying the set current to a first bit line connected to a plurality of first memory cells, the plurality of first memory cells being connected to a plurality of source lines, respectively; and
controlling a plurality of first transistors to sequentially connect each of the plurality of source lines to a ground node.

2. The method of claim 1, further comprising:
supplying the set current to a second bit line connected to a plurality of second memory cells, the plurality of second memory cells being connected to the plurality of source lines, respectively; and
controlling the plurality of first transistors to sequentially connect each of the plurality of source lines to the ground node.

3. The method of claim 1, wherein the supplying the set current to the first bit line comprises controlling a plurality of second transistors connected to a plurality of bit lines to supply the set current to the first bit line.

4. The method of claim 1, wherein heat generated by the set current depends on a state of each of the plurality of first memory cells.

5. The method of claim 1, wherein a set rate depends on a state of each of the plurality of first memory cells.

6. The method of claim 1, wherein a resistance change depends on a state of each of the plurality of first memory cells.

7. A memory device comprising:
a plurality of bit lines;
a plurality of source lines;
a plurality of memory cells each connected one of the plurality of bit lines and one of the plurality of source lines;
a plurality of first transistors connected to the plurality of source lines, respectively;
a plurality of second transistors connected to the plurality of bit lines, respectively;
a current generator connected to the plurality of second transistors and configured to generate a set current; and
a control driver configured to control the plurality of first transistors and the plurality of second transistors to sequentially supply the set current each of the plurality of memory cells.

8. The memory device of claim 7, wherein the control driver is further configured to control the plurality of second transistors to supply the set current to one of the plurality of bit lines.

9. The memory device of claim 8, wherein the control driver is further configured to control the plurality of first transistors to sequentially connect each of the plurality of source lines to a ground node while the set current is suppled to one of the plurality of bit lines.

10. The memory device of claim 7,
wherein the plurality of memory cells include a first memory cell having an amorphous state and a second memory cell having a set state, and
wherein a value of the set current supplied to the first memory cell is same with a value of the set current supplied to the second memory cell.

11. The memory device of claim 10, wherein first heat generated by the set current in the first memory cell is greater than second heat generated by the set current in the second memory cell.

12. The memory device of claim 10, wherein a first set rate of the first memory cell is greater than a second set rate of the second memory cell.

13. The memory device of claim 10, wherein a first resistance change of the first memory cell is greater than a second resistance changes of the second memory cell.

14. A method for compensating resistance drifts of a plurality of memory cells, the method comprising:
generating a set current having a value such that each of the plurality of memory cells recovers from a resistance drift; and
supplying the set current to each of the plurality of memory cells,
wherein the supplying the set current to each of the plurality of memory cells comprises supplying the set current to a first memory cell and a second memory cell of the plurality of memory cells in a first time interval and a second interval, respectively.

15. The method of claim 14,
wherein the first memory cell and the second memory cell are connected to a first bit line,
wherein the first memory cell and the second memory cell are connected to a first source line and a second source line, respectively, and
wherein the supplying the set current to the first memory cell and the second memory cell comprises:
  supplying the set current to the first bit line in a time interval including the first time interval and the second time interval;
  controlling a first transistor to connect the first source line to a ground node in the first time interval; and
  controlling a second transistor to connect the second source line to the ground node in the second time interval.

16. The method of claim 14,
wherein the first memory cell and the second memory cell are connected to a first bit line and a second bit line, respectively,
wherein the first memory cell and the second memory cell are connected to a first source line, and
wherein the supplying the set current to the first memory cell and the second memory cell comprises:
  supplying the set current to the first bit line and controlling a first transistor to connect the first source line to a ground node in the first time interval; and
  supplying the set current to the second bit line and controlling a second transistor to connect the first source line to the ground node in the second time interval.

17. The method of claim 14,
wherein the first memory cell has an amorphous sate,
wherein the second memory cell has a set state, and
wherein the set current has the same value in the first time interval and in the second time interval.

18. The method of claim 17, wherein first heat generated by the set current in the first time interval is greater than second heat generated by the set current in the second time interval.

19. The method of claim 17, wherein a first set rate of the first memory cell is greater than a second set rate of the second memory cell.

20. The method of claim 17, wherein a first resistance change of the first memory cell is greater than a second resistance changes of the second memory cell.

* * * * *